United States Patent
Martens et al.

(10) Patent No.: US 8,673,804 B2
(45) Date of Patent: Mar. 18, 2014

(54) ENHANCING CATALYTIC ACTIVITY OF NANOPOROUS MATERIALS

(75) Inventors: Johan Martens, Huldenbert (BE); Davy Deduytsche, Ghent (BE); Christophe Detavernier, Denderleeuw (BE); Sreeprasanth Pulinthanathu Sree, Heverlee (BE)

(73) Assignees: Katholieke Universiteit Leuven, Leuven (BE); Universiteit Gent, Ghent (BE)

( * ) Notice: Subject to any disclaimer, the term of this patent is extended or adjusted under 35 U.S.C. 154(b) by 652 days.

(21) Appl. No.: 12/795,041

(22) Filed: Jun. 7, 2010

(65) Prior Publication Data

US 2011/0137093 A1 Jun. 9, 2011

Related U.S. Application Data

(63) Continuation-in-part of application No. PCT/BE2008/000101, filed on Dec. 8, 2008.

(30) Foreign Application Priority Data

Dec. 6, 2007 (GB) .................................. 0723841.3

(51) Int. Cl.
*B01J 21/08* (2006.01)
*B01J 29/06* (2006.01)
*B01J 29/072* (2006.01)

(52) U.S. Cl.
USPC .............. 502/61; 502/240; 502/258; 502/73; 502/74

(58) Field of Classification Search
None
See application file for complete search history.

(56) References Cited

U.S. PATENT DOCUMENTS

| 6,043,177 | A | 3/2000 | Falconer et al. |
| 6,051,517 | A * | 4/2000 | Funke et al. ................ 502/4 |
| 6,613,383 | B1 | 9/2003 | George et al. |
| 6,660,713 | B2 * | 12/2003 | Carter et al. ................ 510/507 |
| 2003/0089639 | A1 * | 5/2003 | Chester et al. ........... 208/120.01 |
| 2004/0159830 | A1 | 8/2004 | Weimer et al. |
| 2010/0008990 | A1 | 1/2010 | Martens et al. |

FOREIGN PATENT DOCUMENTS

| WO | 92/13631 A1 | 8/1992 |
| WO | 03/008186 A1 | 1/2003 |
| WO | 2006/102568 A2 | 9/2006 |

OTHER PUBLICATIONS

Janike et al, low silica mcm 41 composites and mesoporuous solids, 1999, chem matter pp. 1342-1351.*
Catana, G. et al., "AlOx Coating of Ultrastable Zeolite Y: A Possible Method for Vanadium Passivation of FCC Catalysts", J. Phys. Chem. B, 2000, vol. 104, pp. 9195-9202, USA.
Oneil, A.S. et al., "Supercritical Fluid-Mediated Alumination of Mesoporous Silica and Its Beneficial Effect on Hydrothermal Stability", J. Am. Chem. Soc., 2002, vol. 124, pp. 16036-16307, USA.
Chen, L.Y. et al., "A Comparison of Post-Synthesis Alumination and Sol-Gel Synthesis of MCM-41 with High Framework Aluminum Content", Microporous and Mesoporous Materials, 1999, Elsevier, vol. 27, pp. 231-242, NL.

(Continued)

*Primary Examiner* — Melvin C Mayes
*Assistant Examiner* — Stefanie Cohen
(74) *Attorney, Agent, or Firm* — Bacon & Thomas, PLLC (57) ABSTRACT

The present invention relates to the use of atomic layer deposition (ALD) techniques to enhance the acid catalytic activity of nanoporous materials.

8 Claims, 6 Drawing Sheets

(56) References Cited

OTHER PUBLICATIONS

Guan, L.C. et al., "Bimodal Pore Size Mesoporous MCM-48 Prepared by Post-Synthesis Alumination", J. Phys. Sci., 2006, vol. 17, No. 1, pp. 65-75, Malaysia.
Mokaya, R. and Jones, W., "Efficient Post-Synthesis Alumination of MCM-41 Using Aluminium Chlorohydrate Containing Al Polycations", J. Mater. Chem., 1998, vol. 9, pp. 555-561, UK.
Oumi, Y. et al., "Novel Post-Synthesis Alumination Method for MCM-41 Using Trimethylaluminum", Microporous and Mesoporous Materials, 2001, Elsevier, vols. 44-45, pp. 267-274, NL.
Lim, B.S. et al., "Atomic Layer Deposition of Transition Metals", Nature Materials, 2003, vol. 2, pp. 749-754, UK.
Puurunen, Riikka, PhD Thesis, "Preparation by Atomic Layer Deposition and Characterisation of Catalyst Supports Surfaced with Aluminium Nitride", Department of Chemical Technology, Helsinki University of Technology, 2002, pp. 1-79, Espoo, Finland.
Puurunen, R.L. et al., "Growth of Aluminium Nitride on Porous Silica by Atomic Layer Chemical Vapour Deposition", Applied Surface Science, 2000, vol. 165, pp. 193-202, NL.
Elam, J.W. et al., "Spatially Controlled Atomic Layer Deposition in Porous Membranes", ECS Transactions, 2007, vol. 11, No. 7, pp. 177-184., USA.
Elam, J.W. et al., "Atomic Layer Deposition for the Conformal Coating of Nanoporous Materials", Journal of Nanomaterials, 2006, pp. 1-5, USA.
Jiang, Ying-Bing et al., "Nanometer-Thick Conformal Pore Sealing of Self-Assembled Mesoporous Silica by Plasma-Assisted Atomic Layer Deposition", J. Am. Chem. Soc., 2006, vol. 128, No. 34, pp. 11018-11019, USA.
Ravishankar, R. et al., "Physicochemical Characterization of Silicalite-1 Nanophase Material", J. Phys. Chem. B, 1998, vol. 102, pp. 2633-2639, USA.
Huybrechts, W. et al., "Development of a Fixed-Bed Continuous-Flow High-Throughput Reactor for Long-Chain N-Alkane Hydroconversion", Appl. Cat. A: General, 2003, Elsevier, vol. 243, pp. 1-13, NL.
Grobet, P.J. et al., "Correct Determination of Aluminium in Y Zeolites by Magic-Angle Spinning N.m.r. Spectroscopy", J. Chem. Soc. Chem. Commun., 1987, vol. 22, pp. 1688-1690, UK.
Weitkamp, Jens, "Isomerization of Long-Chain n-Alkanes on a Pt/Ca Y Zeolite Catalyst", Ind. Eng. Chem. Prod. Res. Dev., 1982, vol. 21, pp. 550-558, USA.
Herrera, J.E. et al., "Synthesis of Nanodispersed Oxides of Vanadium, Titanium, Molybdenum, and Tungsten on Mesoporous Silica Using Atomic Layer Deposition", Topics in Catalysis, 2006, vol. 39, Nos. 3-4, pp. 245-255, USA.
Du, G.D. et al., "Synthesis, Characterization, and Catalytic Performance of Highly Dispersed Vanadium Grafted SBA-15 Catalyst", J. Catal., 2008, Elsevier, vol. 253, pp. 74-90, NL.
Mahurin, S. et al.,"Atomic Layer Deposition of TiO2 on Mesoporous Silica", Journal of Non-Crystalline Solids, 2006, Elsevier, vol. 352, pp. 3280-3284, NL.

International Search Report in PCT/BE2008/000101, Jun. 5, 2009.
McCusker, L.B. et al., "Nomenclature of Structural and Compositional Characteristics of Ordered Microporous and Mesoporous Materials with Inorganic Hosts", Pure Appl. Chem., 2001, vol. 73, No. 2, pp. 381-394, USA.
Rouquerol, J. et al., "Recommendations for the Characterization of Porous Solids", Pure & Appl. Chem., 1994, vol. 66, No. 8, pp. 1739-1758, USA.
Kresge, C.T. et al., "Ordered Mesoporous Molecular Sieves Synthesized by a Liquid-Crystal Template Mechanism", Nature, 1992, vol. 359, pp. 710-712, USA.
Monnier, A. et al., "Cooperative Formation of Inorganic-Organic Interfaces in the Synthesis of Silicate Mesostructures", Science, 1993, vol. 261, pp. 1299-1303.
Zhao, D. et al., "Triblock Copolymer Syntheses of Mesoporous Silica with Periodic 50 to 300 Angstrom Pores", Science, 1998, vol. 279, pp. 548-552, Washington, DC., USA.
Inagaki, S. et al., "Syntheses of Highly Ordered Mesoporous Materials, FSM-16, Derived from Kanemite", Bull. Chem. Soc. Jpn., 1996, vol. 69, pp. 1449-1457, Tokyo, Japan.
Jansen, J.C. et al., "A New Templating Method for Three-Dimensional Mesopore Networks", Chem.Commun., 2001, vol. 8, pp. 713-714, Cambridge, UK.
Janssen, A.H. et al., "Three-Dimensional Transmission Electron Microscopy Observations of Mesopores in Dealuminated Zeolite Y", Angew. Chem. Int. Ed., 2001, vol. 40, No. 6, pp. 1102-1104, NL.
Jacobsen, C.J.H. et al., "Mesoporous Zeolite Single Crystals", J.Am. Chem. Soc., 2000, vol. 122, pp. 7116-7117, USA.
Kim, J.Y. et al., "Template Synthesis of a New Mesostructured Silica from Highly Ordered Mesoporous Carbon Molecular Sieves", Chem. Mater., 2003, vol. 15, pp. 1932-1934, USA.
Tao, Y. et al., "Uniform Mesopore-Donated Zeolite Y Using Carbon Aerogel Templating", J. Phys. Chem. B, 2003, vol. 107, pp. 10974-10976, USA.
Kremer, S.P.B. et al., "Tiling Silicalite-1 Nanoslabs into 3D Mosaics", Adv. Mater., 2003, vol. 15, No. 20, pp. 1705-1707, Germany.
Szostak, R., in H. van Bekkum, E.M. Flanigen, J.C. Jansen (Eds.), "Inroduction to Zeolite Science and Practice", Stud. Surf. Sci Catal. 58, 1991, Elsevier, pp. 153-192, The Netherlands.
Stair, P.C. et al., "Novel, Uniform Nanostructured Catalytic Membranes", Topics in Catalysis, 2006, vol. 39, Nos. 3-4, pp. 181-186, USA.
Anderson, M.W. et al., "Alumination of Highly Siliceous Zeolites", J Chem. Soc., Chem. Commun., 1984, vol. 23, pp. 1596-1597, Cambridge, UK.
Yashima, T. et al., "Alumination of ZSM-5 Type Zeolite with AlCl3", Innovation in Zeolite Materials Science, Stud. Surf. Sci catal. 37, 1988, pp. 175-182, NL.
Kuhl, G.H., in J. Weitkamp, L. Puppe (Eds.), Catalysis and Zeolites, Fundamentals and Applications, Springer 1999, pp. 81-179. (first three pages of website).
Website page of Cambridge Nanotech (first page), downloaded Oct. 29, 2010.

* cited by examiner

27Al MAS NMR

ENHANCING CATALYTIC ACTIVITY OF NANOPOROUS MATERIALS

FIELD OF THE INVENTION

The present invention relates to the use of atomic layer deposition (ALD) techniques to enhance the catalytic activity of nanoporous materials.

BACKGROUND OF THE INVENTION

Overview of Nanoporous Materials

There exists a wealth of inorganic nanoporous materials. Nanoporous materials can be unordered, such as pillared clays and silica gels, or ordered. The ordered porous materials comprise zeolites and zeolite like materials, ordered mesoporous materials and hierarchical materials presenting more than one level of porosity and structural order. Among the ordered nanoporous materials, ordered microporous and mesoporous materials attract a lot of attention by the materials science community (ref. 1). Ordered microporous and mesoporous materials can be described in terms of a host structure, which defines a pore structure, which may contain guest species. The voids between the linked atoms have a free volume larger than a sphere with a 0.25 nm diameter. Pores with free diameters of less than 2 nm are called micropores, and those in the range of 2 to 50 nm mesopores (ref. 2).

When the atoms of the host as well as the voids are arranged periodically with long-range order (at least 10 repeats in all directions) the materials produce sharp maxima in a diffraction experiment. These materials are crystalline. Zeolites and zeolite like materials are such crystalline materials based on a 3-dimensional 4 connected inorganic frameworks. Generally they contain silicon, aluminum and oxygen in their framework and exchangeable cations, water and/or other guest molecules within their pores. The framework structure may contain linked cages, cavities or channels, which are of the right size to allow small molecules to enter. The limiting pore sizes are roughly between 0.3 and 1 nm in diameter. Because of their unique porous properties, zeolites are used in a variety of applications with a global market of several million tons per annum. Major zeolite uses are in catalytic petrochemical processes such as cracking, hydrocracking, alkylation, isomerization, in cation-exchange (water softening and water purification), and in molecular separations and purification of gases and solvents.

Another class of nanoporous materials displays short range order only. They are amorphous with respect to diffraction experiments. When such materials are ordered, the pores are of uniform size with long-range order and produce diffraction maxima at d-values reflecting the pore-to-pore distance. In such ordered mesoporous materials, the pore structure is "crystalline". Examples include MCM-41 (ref. 3), MCM-48 (ref. 4), SBA-15 (ref. 5), FSM-16 (ref. 6), TUD-1 (ref. 7).

Next to crystalline microporous materials and ordered mesoporous materials both having only one type of pores, poly-porous materials exist. A distinction can be made according to the ordering of the different types of porosity. Mesoporous zeolites having a secondary porosity composed of irregular mesopores in addition to the micropores are e.g. applied as Fluid Catalytic Cracking catalysts. The ultrastable Y zeolite as a result of dealumination and partial structure degradation presents intracrystalline mesopores in addition to micropores (ref. 8). The presence of mesopores is important in catalytic applications. These larger pores facilitate the diffusion of larger molecules into the interior of the zeolite crystals.

Mesoporous zeolites can be obtained using the replica technique, whereby the zeolite is grown within the pores of various kinds of carbon template (ref. 9-11). Another approach for building poly-porous materials involves the linking of microporous building units into materials that are ordered at the mesoscale. Zeotiles are examples of such hierarchical materials (ref. 12 and 13). Zeotiles are robust materials capable of withstanding higher temperatures and combine the advantages of both micro and mesoporous materials (ref. 12 and 13).

Functionalization of Nanoporous Materials

For application in catalysis, nanoporous materials need to be functionalized. In silicate frameworks, the introduction of trivalent elements such as aluminum, gallium or iron (but not limited to these elements) generates positive charge deficiencies in the oxide framework that needs to be compensated by cations in the pores. Charge compensation with a proton generates Brönsted acidity in the material.

The conversion of an as-synthesized zeolite into a Brönsted acid zeolite can be obtained via different routes. When the lattice charge is compensated by organic cations, calcination to remove the organic molecules converts the as-synthesized zeolite into an acid zeolite. Alkali and alkaline earth metal cation can be replaced with protons through cation exchange with an ammonium salt and deammoniation via heating, or else through contacting of the zeolite with diluted acid. Cation exchange with multivalent cations such as $La^{3+}$ followed by calcination is another method known in the art to generate Brönsted acid sites in a zeolite.

Nanoporous materials often have insufficient Brönsted acidity for a desired catalytic application. Many kinds of modifications have been reported to enhance the Brönsted acidity and the catalytic activity. Other modifications aim at altering the porosity and surface chemistry.

Post synthesis modifications of zeolites include a lot of techniques to further control the acidity or the shape selectivity of a specific zeolite structure. There are three main types of post synthesis modification which can be applied to a zeolite (ref. 14): (i) structural modification in which the framework $SiO_2/M_2O_3$ molar ratio (where M=Al or another trivalent metal cation) is altered resulting in a change in acidity; (ii) modification of the surface of the zeolite crystal to adapt the size of the pore opening; (iii) internal pore modification which block or alter the acid sites or restrict the internal pore diameter. If the material is meant for catalytic application then it has to maintain a sufficient structural integrity.

There are several ways to decrease the aluminum content of a zeolite, e.g. by steaming, acid leaching or contacting the zeolite with an aluminum complexing agent such as ethylene diamine tetra acetate.

For enhancing the content of trivalent elements such as $Al^{3+}$ there are several options. In the prior art, many reports primarily deal with the alumination of zeolites, but the person skilled in the art understands that other trivalent elements can be incorporated in nanoporous materials in a similar manner. The incorporation of trivalent elements directly during the crystallization of the zeolite is sometimes difficult. In the so-called high silica zeolites, the acid catalytic activity is limited because of the small percentage of trivalent elements, particularly aluminum, incorporated in the zeolite framework during crystallization. Imparting greater activity for those zeolites can be achieved by inserting trivalent elements, particularly aluminum atoms into the framework in a post-synthesis operation. Several methods have been used to incorporate trivalent elements such as aluminum or gallium into high silica zeolites (ref. 14). A first method is the hydrothermal treatment of the zeolite material with aqueous aluminate solution. The zeolite to be aluminated is then treated with an aqueous solution of aluminate salt under hydrothermal conditions. The aluminate reacts with the silanol groups of a hydroxyl defect site inside the zeolite channels. Sometimes an aluminum atom is inserted into a tetrahedral vacancy where it substitutes for a framework silicon atom. For example, ZSM 5 zeolite with enhanced n-hexane cracking activity can be obtained by treating essentially inactive high silica ZSM 5 zeolite with sodium aluminate solution in an autoclave (ref 15).

Treatment with Aluminum halide vapors is another proven method for aluminum incorporation into zeolites. It has been confirmed by $^{27}Al$ magic angle spinning NMR and IR spectroscopy that when highly siliceous zeolite such as Silicalite is treated with $AlCl_3$ vapor at elevated temperature (500-600° C.), aluminum atoms take the position of silicons in the zeolite framework. Through such modification, a considerable amount of aluminum is also incorporated in the pores outside of the framework, where it adopts an octahedral coordination (ref. 16). The aluminum insertion can be obtained by reaction of silanol groups with $AlCl_3$ or by the substitution reaction of silicon atoms of the framework by aluminum atoms provided as $AlCl_3$ reagent. Strong acid sites including both Brönsted and Lewis acid sites were generated together with the acid sites of normal strength observed for ordinary ZSM-5 zeolite. (ref. 17)

$AlO_x$ coating of the pores of ultrastable zeolite Y (USY) has been proposed as a possible method for vanadium passivation of Fluid Catalytic Cracking catalysts. Two coating methods were presented: (i) the deposition of the $[Al_{13}O_4(OH)_{24}(H_2O)_{12}]^{7+}$ ($[Al_{13}]$) complex from aqueous solutions and (ii) the anchoring of alumoxane by in situ triisobutylaluminum hydrolysis followed by calcination. (ref. 18)

Various ways for post synthesis incorporation of trivalent elements, such as aluminum, in ordered mesoporous materials have been reported. Post synthesis alumination of siliceous ordered mesoporous materials in principle offers advantages over the direct incorporation during synthesis. Aluminum often interferes with the ordering process during the formation process of the ordered mesoporous material. The accessibility to active aluminum sites incorporated during synthesis may be limited owing to pore blockage. In post synthesis incorporation of trivalent elements such as post synthesis alumination, the challenge is to obtain a well dispersed and uniform distribution of the trivalent elements such as aluminum over all mesopores of the material. Aluminum reagents when contacted with the ordered mesoporous silica tend to react and be deposited in the pore openings. The presence of long, mono-dimensional mesopores hinders the spreading of the trivalent element over the internal body of the material. Techniques which can uniformly disperse said trivalent elements, such as aluminum into the mesopores are of great interest (ref. 19).

In the literature, the preparation of aluminum-containing mesoporous MCM-41 materials was obtained by post-synthesis modification of a purely siliceous MCM-41 using different Al sources: $AlCl_3$, aluminum isopropoxide and $NaAlO_2$. The structure, thermal stability and acidity of these materials have been investigated and compared with Al-MCM-41 prepared by direct hydrothermal synthesis. Irrespective of the preparation method, the surface area, pore diameter, crystallinity and thermal stability of Al-MCM-41 decreased with increasing Al content. Post-synthesis modified materials possessed better thermal stability, and this method allows for the incorporation of more aluminum without disintegration of the mesoporous structure as compared to Al-MCM-41 prepared by direct hydrothermal synthesis. The post-synthesized Al-MCM-41 had a moderate acidity, comparable to that of the direct hydrothermally-synthesized material. (ref. 20)

The alumination of siliceous MCM-48 containing organic templates with sodium aluminate solution has been reported (ref. 21). The modification altered the porosity quite significantly.

Aluminium chlorohydrate solution which contains Al polycations was reported to be an efficient source of Aluminum for post-synthesis alumination of purely siliceous MCM-41. The material retained excellent structural integrity and showed enhanced acidity and catalytic activity. The amount of Al incorporated into the MCM-41 framework was dependent on the concentration of Al in the grafting solution; $^{27}Al$ MAS NMR confirmed that a large proportion of the Al atoms was inserted into tetrahedral positions within the framework. TEM and XPS indicated that there were no separate surface alumina phases. The pore wall thickness increased with Al content, but pore size uniformity was maintained. Alumination generated Brønsted acid sites which increase in population as the Al content rose. Those materials exhibited considerable catalytic activity for cumene cracking and were superior to $AlCl_3$-grafted MCM-41 or aluminum chlorohydrate grafted amorphous silica. (ref. 22)

O'Neil et al. investigated the use of supercritical solvents for post synthesis alumination of ordered mesoporous silica. O'Neil et al. prepared aluminum grafted MCM-41 material by reacting pure silica MCM-41 with aluminum isopropoxide in supercritical $CO_2$ or propane. The supercritical fluid was shown to provide efficient transport of the aluminating agent into the mesoporous material. (ref. 19)

In another investigation, dry MCM-41 sample was dispersed in dry toluene containing various amounts of trimethylaluminum (TMA). The resulting mixture was maintained at room temperature for 48 h without stirring. Aluminum was found to be inserted into tetrahedral positions within the framework at room temperature. No further calcination was required. It was decided that TMA is an efficient aluminum source for the post-synthesis alumination. (ref. 23)

This literature overview teaches that incorporation of trivalent elements in mesoporous silicate-based materials, more in particular the alumination of said mesoporous silicate-based materials, can be achieved. The methods currently applied require the use of an aqueous medium, or of organic or supercritical solvents. The use of gaseous reagents such as $AlCl_3$ appeared to be less successful.

Atomic Layer Deposition (ALD) Technique

Atomic layer deposition (ALD) is a process for depositing highly uniform and conformal thin films by alternating exposures of a surface to vapors of two chemical reactants (ref. 24). Atomic Layer Deposition (ALD) is used to deposit thin films with special features. The technology was originally developed for the fabrication of polycrystalline luminescent ZnS:Mn and amorphous $Al_2O_3$ insulator films for electroluminescent flat panel displays. Even though the ALD technology showed some benefits, the deposition rate was too low to make it economical at that time. Due to its complex surface chemistry, no real break-through involving ALD was achieved until 1985.

The decreasing device dimensions and increasing aspect ratios in the micro-electronics industry increased interest towards the ALD technique during the 1990s. ALD processes are attractive for a variety of applications in micro-electronics: deposition of diffusion barriers, dielectric films and electrodes for DRAM capacitors and thin dielectric films for gate stack applications. ALD has been used to deposit various materials, including several oxides, nitrides and pure metals.

Since this is a layer-by-layer deposition technique it produces films of uniform thickness and excellent conformality.

Different from chemical vapor deposition (CVD), ALD technology is based on saturated surface reactions. The principle of ALD is based on sequential pulsing of chemical precursor vapors, which form about one atomic layer each pulse. This generates pinhole free coatings that are extremely uniform in thickness, even deep inside pores, trenches and cavities. (ref. 25)

The intrinsic surface control mechanism of the ALD process is based on the saturation of sequentially performed surface reaction between the substrate and precursor. The saturation mechanism makes the material growth rate directly proportional to the numbers of reaction cycles instead of the reactant concentration or time of growth.

The advantages of atomic layer deposition technique can be enumerated as follows:

1. Digital thickness control to atomic level (no rate monitor needed, just set the number of atomic layers).
2. Perfect 3D conformality, 100% step coverage: uniform coatings on flat, inside porous and around particle samples.
3. Large area thickness uniformity.
4. Potential for batch scalability (precursor sources are small and stacking of substrates is possible).
5. Pinhole free films, even over very large areas.
6. Excellent repeatability (wide process windows: many ALD processes are not very sensitive to temperature or precursor dose variations).
7. Low defect density.
8. Excellent adhesion due to chemical bonds at the first layer.
9. Digital control of sandwiches, heterostructures, nanolaminates, mixed oxides, graded index layers and doping.
10. Gentle deposition process for sensitive substrates (although a plasma may be used to enhance the deposition rate for certain processes, thermal ALD is often sufficient).
11. Low temperature deposition possible (RT-400C).
12. Atomically flat and smooth coating, copies shape of substrate perfectly.
13. Low stress because of molecular self assembly.
14. 100% film density guarantees ideal material properties (m, Ebd, k, etc).
15. Insensitive to dust (grows underneath dust!).
16. The deposition of thin films of a variety of materials has been reported (oxides, nitrides, metals and semiconductors).
17. The deposited film can be either amorphous or crystalline depending on the substrate and the deposition temperature.
18. Coatings have been reported on a variety of substrates (glass, plastics, Si, metals etc).
19. High production yields due to all these process benefits.

There are two fundamental self-limiting mechanisms in ALD: chemisorption saturation process followed by exchange reaction (CS-ALD) and sequential surface chemical reaction (RS-ALD).

The treatment of materials by ALD typically proceeds as follows.

First the material needs to be pretreated to bring the surface in a reactive state. This is typically carried out by heat treatment, although the use of a plasma may also be beneficial. Physisorbed molecules, most often water adsorbed from ambient air, are removed.

Step 1: Saturating reaction of a gaseous reactant (reactant 1, typically a metal compound) with the reactive sites on the support surface. The reaction is allowed to proceed until the surface is saturated with the adsorbing species and no more reaction takes place. Thereafter, excess reactant and possible gaseous reaction products are removed by an inert gas purge or by evacuation.

Figure 1:
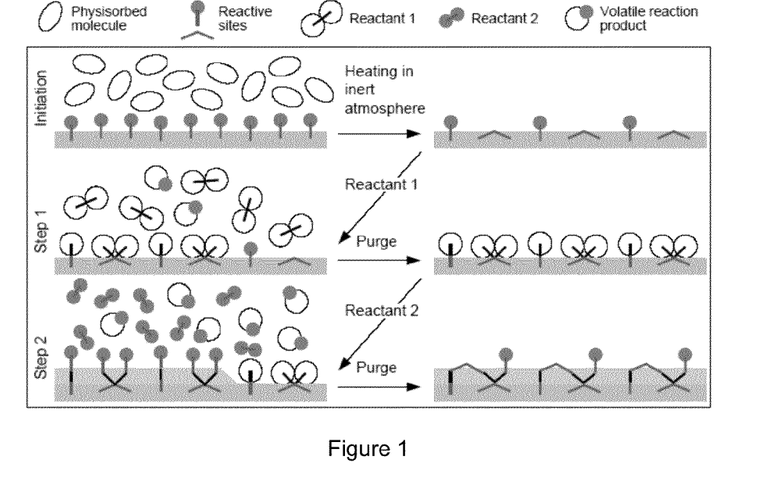
FIG. 1. Schematic illustration of the steps leading to growth of MZx materials (M denotes metal, Z non-metal) by ALD.

Step 2: Saturating reaction of another reactant (reactant 2, typically a non-metal compound) with the reactive sites on the support. The adsorbed species left behind by the first reactant form a major part of the reactive sites. Excess reactant and the gaseous reaction products are removed. The steps are schematically presented in FIG. 1 (ref. 26).

The atomic layer deposition technique has been applied in the area of catalyst preparation. Atomic layer deposition was used to prepare aluminum nitride on porous silica and alumina supports and to deposit catalytically active components on the obtained AlN/oxide supports. There are reports on aluminum nitride grown on porous silica by atomic layer deposition from trimethylaluminum and ammonia precursors. The ALD growth is based on altering, separated saturating reactions of the gaseous precursors with the solid substrate. The growth and the surface reactions were investigated by elemental analysis and solid state NMR measurements for $^{27}$Al and $^{29}$Si (ref. 26-27).

Active transition metal catalysts have been produced by ALD for a variety of purposes. They are listed in Table 1 (ref. 26).

TABLE 1

Examples of reactions for which catalysts have been prepared by ALD and description of the catalyst (ref. 26)

| Reaction | Catalyst | Support | Reactants |
|---|---|---|---|
| Alkane dehydrogenation | $CrO_x$ | Alumina | $Cr(acac)_3$, [a]air |
|  | $VO_x$ | Silica, alumina | $VO(acac)_2$, air |
| Ethene hydroformylation | Co | Silica | $Co(acac)_3$, air |
| Toluene hydrogenation | Ni | Alumina | $Ni(acac)_2$, air |
|  | Co | Silica | $Co(acac)_3$, air[b] |
|  | Co | Alumina | $Co(acac)_2$, air[b] |
| Alkene metathesis | $WO_x$ | Silica, alumina, magnesia | $WOCl_4$ or $WCl_6$, air |
| Methane oxidation | $CoO_x$ | Zirconia | $Co(acac)_3$, air[b] |
| Methanol oxidation | $TaO_x$ | Silica, alumina, zirconia | $Ta(OC_2H_5)_5$, air |
|  | $VO_x$ | Silica, alumina, zirconia | $VO(acac)_2$, air |
| Alkene polymerisation | $CrO_x$ | Silica | $Cr(acac)_3$, air |
|  | $CrO_x$ | Silica | $CrO_2Cl_2$ |
| Alcohol dehydration | $ZrO_2$ | Alumina | $ZrCl_4$, $H_2O$ |

ALD is reported to be used for the modification of zeolite or molecular sieve membranes to decrease the effective pore size for molecular separation purposes. (ref. 28, ref. 40) Uniform nanostructured catalytic membranes had been fabricated by a combination of anodic aluminium oxidation and atomic layer deposition. The ALD method makes it possible to control pore diameters on the angstrom scale. (ref. 29)

Spatially controlled atomic layer deposition of ZnO, $TiO_2$, $V_2O_5$ and $Nb_2O_5$ in anodized aluminum membranes have been reported (ref. 30). Conformal coating of metals over nanoporous AAO and $SiO_2$ aerogels which can have applications in catalysis and gas sensors is known in the art. (ref. 31)

A plasma-assisted ALD process has been developed in which the ALD precursors are chosen to be nonreactive unless triggered by plasma, so that ALD can be spatially defined by the supply of plasma irradiation. Since plasma cannot penetrate within the internal porosity of mesoporous silica, ALD has been successfully confined to the immediate surface. This technique is useful for sealing of porous low dielectric constant films with a conformal layer and for progressive reduction of the pore size of mesoporous membranes. (ref. 32)

Several studies reported that ALD mediated grafting of vanadium and other elements, such as molybdenum and tungsten, on mesoporous silica by keeping the system in rigorous dry and unhydrated conditions resulted in superior catalytic performance in redox reactions (ref. 37-38).

Mahurin et al. (ref. 39) described the atomic layer deposition of $TiO_2$ on mesoporous silica by ALD using $TiCl_4$ and water reactants as a means to functionalize the mesoporous material. However, this will not significantly improve the activity of the mesoporous material in reactions demanding acid catalytic sites.

SUMMARY OF THE INVENTION

A first aspect of the present invention relates to methods for increasing the catalytic activity of a silicate-based nanoporous material comprising the use of atomic layer deposition to incorporate a chemical element in said material, wherein said element is provided for ALD in a gaseous compound comprising said element. ALD under conditions favoring the hydrolysis of a compound comprising said chemical element was found to be an advantageous method for introducing said element into silicate-based nanoporous materials and enhancing the catalytic activity of said material. The method is particularly suited for introducing trivalent elements, preferably Aluminum, Gallium, Iron or Boron, most preferably aluminum into ordered mesoporous materials, hierarchical materials and mesoporous zeolites. A preferred embodiment of the present invention relates to the incorporation of Aluminum in said silicate based nanoporous materials using atomic layer deposition cycles with trimethylaluminum and water reactants. The incorporation of aluminum in four-, five- and sixfold coordination detected via $^{27}Al$ MAS NMR enhances the acidity of the modified materials. The method is practical for enhancing the catalytic activity of nanoporous materials in which the incorporation of trivalent elements, preferably aluminum through direct synthesis is difficult to achieve. Using the new method, zeolites that became deactivated during operation because of dealumination can be reactivated in a convenient way. Trivalent elements, preferably aluminum, can be selectively deposited on the external surface of nanozeolites.

Another aspect of the present invention relates to the use of a silicate-based nanoporous material with enhanced acid catalytic activity obtained by a method according to the first aspect of the present invention for the hydroconversion of hydrocarbons.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

DETAILED DESCRIPTION OF ILLUSTRATIVE EMBODIMENTS OF THE INVENTION

Legends to the Figures

DESCRIPTION

In the context of the present invention the term "silicate based nanoporous material" refers to porous material with a matrix based on silicon oxide with pore diameter less than 100 nm. Ordered microporous and mesoporous materials can be described in terms of a host structure, which defines a pore structure, which may contain guest species. The voids between the linked atoms have a free volume larger than a sphere with a 0.25 nm diameter. Pores with free diameters of less than 2 nm are called micropores, and those in the range of 2 to 50 nm mesopores (ref. 2). For pore shapes deviating from the cylinder, the above ranges of diameter of micropores and mesopores refer to equivalent cylindrical pores.

In the context of the present invention the term 'zeolite' refers to a crystalline microporous material comprising coordination polyhedra formed only of silicon, aluminum and oxygen. Non-aluminosilicate analogs of microporous crystals such as pure silicates, titanosilicates, silicoaluminophosphates and borosilicates, ferrosilicates, germanosilicates and gallosilicates, that exhibit the characteristic molecular-sieving properties similarly to zeolites, are referred to as 'zeolite-like' materials. In the present invention both zeolites and zeolite-like materials are encompassed by the term 'zeolite'. A publication entitled "Atlas of Zeolite Structure Types", 5th Revised Edition (2001) by authors W. M. Meier, D. H. Olson and Ch. Baerlocher, is a good source of the known zeolites and zeolite-like materials. More particularly the term "zeolite" refers to zeolites and zeolite-like material having a zeolite framework of the type AEI, AEL, AFI, AFO, AFR, AFX, ATN, ATO, BEA, CDO, CFI, CHA, CON, DDR, DON, EMT, EON, EUO, FAU, FER, IFR, IHW, ISV, ITE, ITH, ITW, IWR, IWV, IWW, LEV, LTA, LTL, MAZ, MEI, MEL, MER, MFI, MFS, MOR, MOZ, MSE, MSO, MTF, MTN, MTT, MTW, MWW, NON, RRO, RTE, RTH, RWR, SFE, SFF, SFG, SFH, SFN, SGT, SSY, STF, STT, TON or TUN (http://izas-c.ethz.ch/fmi/xsl/IZA-SC/ft.xsl). In the context of the present invention the term nanozeolites refer to nanosized zeolites with particle size of less than 300 nm, preferably less than 200 nm. The term "hierarchical material" as used in the present invention means a material having a double porosity on the scale of each of its particles: mesoporosity [i.e. a porosity organized on the mesopore scale], and a zeolitic type microporosity.

It was found that incorporating trivalent elements, in particular aluminum, in various silicate based nanoporous materials using an atomic layer deposition process resulted in an unexpected spectacular gain in catalytic activity. Without being bound by theory, this surprising gain in catalytic activity can at least in part be explained by a reinforcement of the acid strength by introducing tetrahedral, distorted tetrahedral, pentacoordinated and octahedrally coordinated aluminum into said nanoporous material.

The present invention provides a method for increasing the acidic catalytic activity of a silicate-based nanoporous material, said method comprising the incorporation of a chemical element in said material using an atomic layer deposition (ALD) process under conditions favoring the hydrolysis of a compound comprising said chemical element, most preferably using water as one of the reactants of said ALD process.

Said atomic layer deposition process may be a thermal ALD or a plasma-enhanced ALD, comprising:

(i) a first saturating reaction of a gaseous reactant, preferably a metal compound coordinated with ligand groups, with the reactive sites (hydroxyl groups) of said silica based nanoporous material to form molecular bonded structures on said nanoporous material that comprise the metal atoms coordinated with the ligand group or with a modified ligand group that results from the reaction and bonded to oxygen atoms that are bonded to said nanoporous substrate atoms (e.g., silicon atoms), (ii) removal of the excess reactant and possible gaseous reaction products by inert gas purge with $N_2$ or noble gasses, or by evacuation, (iii) a second saturating reaction of another gaseous reactant, preferably water, with the reactive sites on the support, with the adsorbed metal left behind by the first reactant forming a major part of said reactive sites. This reaction comprises the hydrolysis of the bonds between the metal atom and the ligand or modified ligand group.

(iv) removal of the excess reactant and gaseous reaction products,

In the context of the present invention, said first gaseous reactant, preferably a metal compound coordinated with ligand groups, includes, but is not limited to, a metal halide, a metal alkyl compound, a metal alkoxide, a metal beta-diketonato compound, a metal cyclopentadienyl compound, a metal carboxylate, a metal hydride, a metal alkylamide or silylamide, a metal amidinate or a bimetallic compound, or combinations thereof, wherein said metal compound is preferably aluminum, gallium, iron (III) or boron.

In a preferred embodiment the element or metal which is incorporated is a trivalent element or trivalent metal, such as Aluminum, Gallium, Boron or Iron, most preferably Aluminum. In a particular embodiment of the present invention Aluminum is incorporated in said silicate-based materials using ALD cycles with trimethylaluminum and water reactants, in particular by first exposing said silicate-based materials to the gaseous trimethylaluminum followed by purging with an inert gas, and subsequently exposing the silicate-based materials to vapors of water to complete the ALD cycle.

In another embodiment of the present invention gallium is incorporated in said silicate-based materials using ALD cycles with $Ga(acac)_3$ (acac=pentane-2,4-dionate) and water reactants. In particular, said silicate-based materials are first exposed to the gaseous $Ga(acac)_3$ followed by purging with an inert gas, and subsequently exposed to vapors of water to complete the ALD cycle.

In yet another embodiment of the present invention iron or boron are incorporated in said silicate-based materials using ALD cycles with iron acetylacetonate ($Fe(acac)_3$), or halides of iron or boron, such as $FeCl_3$ or $BBr_3$ and water reactants.

In a preferred embodiment of the present invention, the nanoporous material is selected out of the group consisting of mesoporous zeolites, nanozeolites, ordered mesoporous materials and hierarchical materials.

A particular embodiment of the present invention relates to the use of an ALD process with trimethylaluminum and water reactants for reactivating silicate-based nanoporous materials, most preferably zeolites, that became deactivated during operation because of dealumination.

Another aspect of the present invention relates to the use of a silicate-based nanoporous material with enhanced acidic catalytic activity obtained by said method of the present invention for the hydroconversion of hydrocarbons.

A third aspect of the present invention relates to the use of said method with aluminum and water reactants for selectively aluminating the external surface of nanozeolites.

It is recognized that ALD reaction conditions (such as number of ALD cycles, ALD cycle time, ALD temperature) may be varied in the various embodiments of the invention, as known by a person skilled in the art. The choice of said reaction conditions will depend in part upon the desired porosity and catalytic activity of the treated material, and the properties of the gaseous metal compound reactant. It is understood that larger gaseous metal comprising reactants may require longer reaction times.

EXAMPLES

Example 1

Preparation of Silicalite-1 (nanozeolite)

37.32 g TEOS (Acros, 98%) was hydrolyzed in 32.13 g aqueous TPAOH solution (Alfa, 40 wt %) under stirring. Initially, a separated layer of TEOS was formed on top of the TPAOH solution. Upon vigorous stirring, the mixture turned into an emulsion and, as the TEOS was hydrolyzed, gradually transformed into a clear sol. Then 30.55 g of water was added and the stirring continued for another 24 hours. The clear precursor sol (CS) was then refluxed at 95° C. for three days. The products were cooled to room temperature. The colloidal particles produced were then separated from the mother liquor by centrifugation (15 000 rpm, 15 min). The supernatant liquid was removed and the zeolite product redispersed in water. The powder was washed until the pH of the supernatant was lower than pH 9. The dried powder material was calcined at 550° C. The particle size of such silicalite material typically is below 200 nm (ref. 33).

Example 2

Synthesis of Zeotile-4

A clear solution (CS) was prepared by mixing 37.32 g TEOS (Acros, 98%) and 32.13 g aqueous TPAOH solution (Alfa, 40 wt %) under stirring. The mixture upon stirring turned into an emulsion and, as the TEOS was hydrolyzed, gradually transformed into a clear sol. To this 30.55 g of water was added and stirring continued for another 24 hours. Next, 10 g of pluronic 123 triblock copolymer from BASF ($EO_{20}PO_{70}EO_{20}$) was dissolved in 90 g water under stirring. An amount of 24 g of this template solution was combined with 8 g of 5 M HCl solution. 18 g of clear solution (CS) was combined with another 9 g 5 M HCl under vigorous stirring. Subsequently, it is combined with the acidic triblock copolymer solution. Then the mixture was heated at 90° C. under quiescent conditions for 96 h. A solid product was formed and separated from the liquid by centrifugation at 12 000 rpm. The product was washed with water until the pH exceeded the value of 3. The sample was dried at 60° C. for 24 h and finally calcined at 350° C. for 24 h with a heating rate of 0.5° C. $min^{-1}$ under air atmosphere. The XRD pattern confirmed the successful synthesis of Zeolite-4 like in reference 13.

Example 3

Alumination of Ultrastable Y Zeolite (Mesoporous Zeolite) using ALD

The ultrastable Y zeolite was a commercial powder sample with code name CBV-712 from PQ Corporation.

Figure 2:
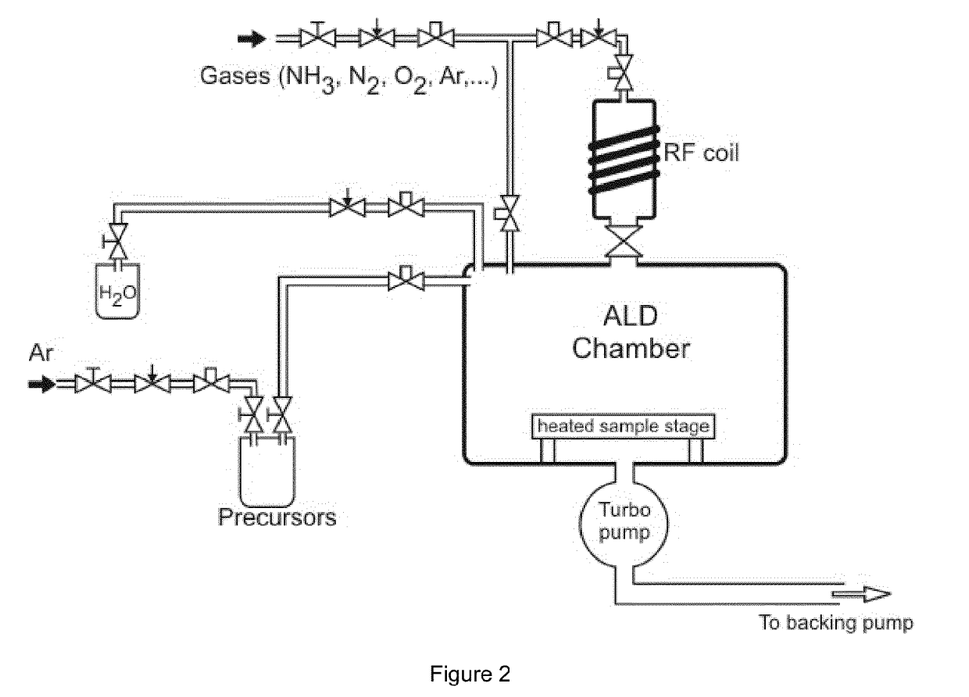
FIG. 2. Schematic diagram of ALD reactor.

The ALD reactor was a home-built pump-type reactor (see FIG. 2). The stainless steel walls of the reactor can be either watercooled, or intentionally heated up to 200° C. The ALD chamber is continuously pumped by a turbomolecular pump. The flow gases are controlled by needle valves and computer controlled pneumatic valves. The reaction gases are either directly injected into the chamber (thermal ALD), or can flow through an ICP-RF plasma source (plasma-enhanced ALD). For the present experiments, TMA and water were used as reagents, and no plasma was used. Since the vapor pressure of TMA is sufficiently high, no Ar flow was required through the precursor bottle. During deposition, the chamber walls were heated to 80° C.

The ultrastable Y zeolite powder (350 mg) was introduced in an Al vessel, which was placed on top of a resistive heater. The zeolite contained ca. 20% water. During a first series of experiments, the powder was loaded overnight in the ALD reactor at a temperature of 100° C., resulting in a base pressure of $1*10^{-7}$ mbar. Alternatively, water desorption could be achieved by heating the powder in a tube furnace for 3 hours at 150° C. After loading the powder in the ALD chamber, a base pressure of $2.10^{-6}$ mbar could be achieved.

An amount of ca.300 mg of zeolite powder was subjected to ALD cycles at 200° C. Two different types of cycles were used.
(1) Cycles of 480 s, comprising 120 s of exposure to TMA, 120 s evacuation, 120 s exposure to $H_2O$ pulse and 120 s evacuation: different samples were subjected to 5 (Z5), 10(Z3) and 30(Z1) cycles.
(2) Cycles of 120 s, comprising 30 s of exposure to TMA, 30 s evacuation, 30 s exposure to $H_2O$ and 30 s evacuation. Zeolite samples were exposed to 10 (Z4) and 30 (Z2) cycles.

Example 4

Alumination of Silicalite-1 (Nanozeolite Material) using ALD

The ALD experiment was similar to that performed on the ultrastable Y zeolite in example 3. For this powder, no water desorption step was required. Aluminum deposition on silicalite-1 powder sample from example 1 was done at 200° C. in 10 cycles. A cycle comprised 30 s TMA exposure, 30 s evacuation, 30 s $H_2O$ exposure and 30 s evacuation.

Example 5

Alumination of Zeotile-4 (Hierarchical Material) Using ALD

The ALD treatment was performed on the Zeotile-4 sample from example 2. The zeotile sample was initially heated to 200° C. for 2 h in vacuum to desorb the water. The base pressure after 2 h was $2.10^{-6}$ mbar. ALD deposition was also performed at 200° C. The treatment consisted of 10 cycles, each comprising 30 s exposure to TMA, 30 s evacuation, 30 s H2O exposure and 30 s evacuation.

Example 6

Decane Hydroconversion Over Aluminated Ultrastable Y Zeolite

The catalytic activity of the aluminated zeolites was evaluated using the decane hydroconversion as probe reaction.

The aluminated ultrastable Y zeolite from example 3, subjected to 30 cycles of 120 s (Z2) was impregnated with an aqueous $Pt(NH_4)_3Cl_2$ solution to obtain a loading of 0.5 wt. %.

For comparison purposes, a parent CBV-712 zeolite sample was loaded with 0.5 wt. % of Pt metal.

Catalyst pellets with a size between 125 and 250 μm were obtained by compressing the Pt-impregnated USY zeolite powder, crushing into flakes and sieving. Amounts of 35 mg of catalyst pellets were loaded in a microreactor of a high throughput reactor unit described in Ref. 34. The catalyst pretreatment procedure comprised heating to 400° C. at 5° C./min under oxygen flow for 1 h, flushing with nitrogen for 25 min, and finally a reduction under flowing hydrogen at 400° C. for 1 h without intermittent cooling. The reactor was cooled to the reaction temperature of 150° C. The unit is operated at a total pressure of 0.45 MPa and a hydrogen to hydrocarbon molar ratio of 375. The contact time was 2522 kg·s/mol. Reaction product analysis was done using online gas chromatography.

Figure 3:
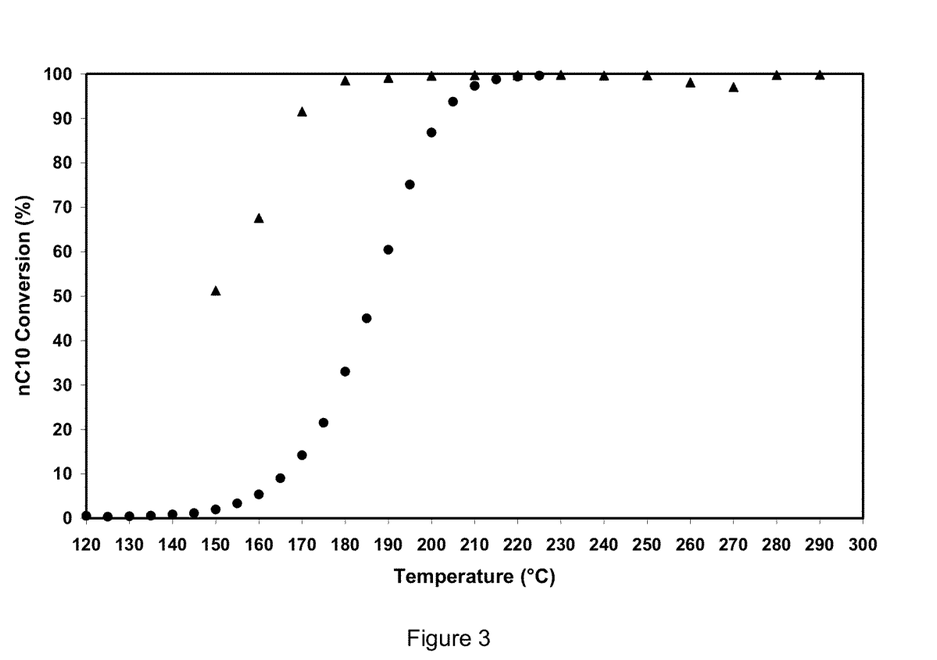
FIG. 3. Decane conversion as a function of temperature over CBV-712 (•) and TMA 30 Cycles-120 s (▲).
Figure 4:
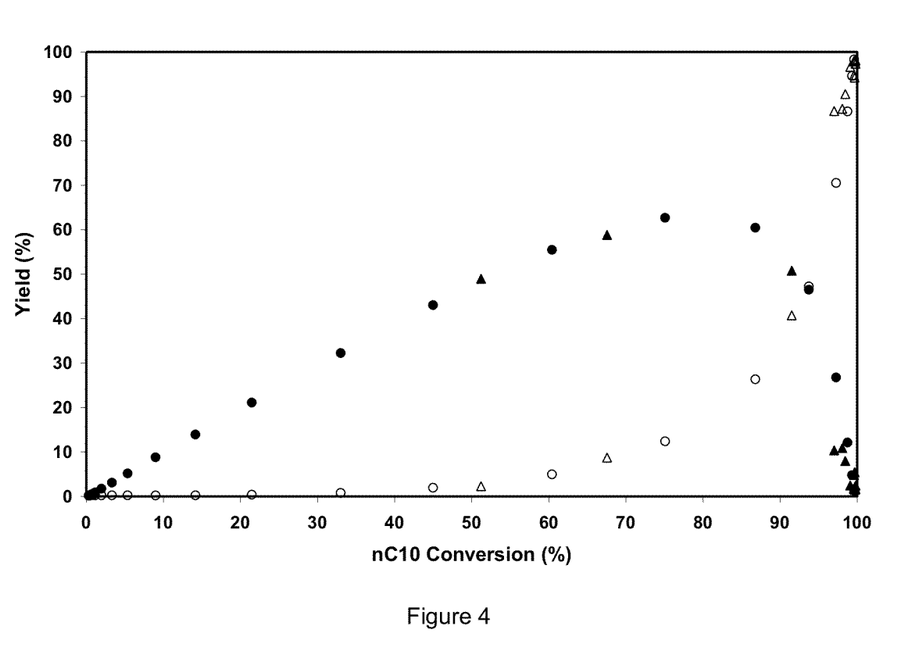
FIG. 4. Yield as a function of decane conversion over parent CBV-712 (iso:•; crack:○) ALD modified CBV-712 30 cycles-120 s (iso:▲; crack:△).

The conversion of decane at increasing reaction temperature is shown in FIG. 3. The aluminated zeolite sample converts decane at substantially lower temperatures compared to the parent sample. The conversion curve is shifted by more than 30° C. to lower temperatures by ALD of aluminum. The yields of decane skeletal and of cracked products are plotted against decane conversion in FIG. 4. The parent zeolite and the ALD modification display the same yields for isomers and cracked products (FIG. 4).

Example 7

$^{27}Al$ MAS NMR Analysis for Aluminated Ultrastable Y Zeolite

Aluminated ultrastable Zeolite Y samples from example 3 were characterized by $^{27}Al$ MAS NMR. The spectra were recorded on a Bruker DSX400 spectrometer (9.4 T). 12000 scans were accumulated with a recycle delay of 100 ms. The samples were packed in 2.5 mm rotors. The spinning frequency of the rotor was 20 kHz. 0.1 M aqueous solution of $Al(NO_3)_3.9H_2O$ was used as shift reference.

Figure 5:
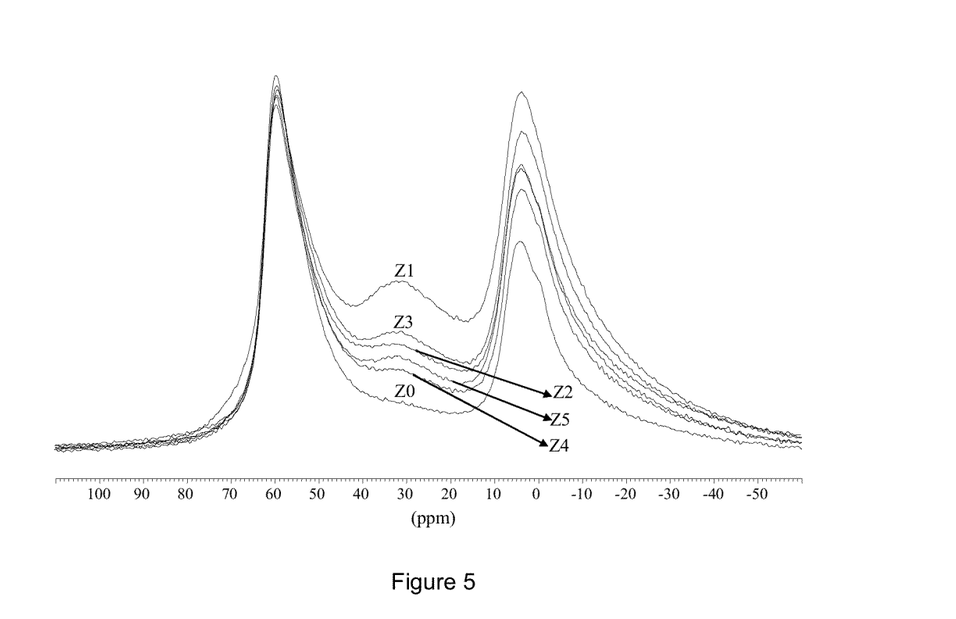
FIG. 5. $^{27}Al$ MAS NMR spectra of ultrastable Y zeolite subjected to different alumination treatments using the ALD treatment of example 3.

The $^{27}Al$ MAS NMR spectra present essentially three signals (FIG. 5). The signal around 60 ppm is due to aluminum atoms in tetrahedral coordination incorporated in the zeolite framework. The signal around 30 ppm is due to distorted tetrahedral aluminum atoms and pentacoordinated aluminum atoms partially attached to the silicate framework (ref. 35). The signal around 0 ppm is due to extraframework aluminum in octahedral coordination.

The signal of tetrahedral aluminum was little influenced by the ALD treatment. There was a substantial gain in intensity for the 30 ppm and 0 ppm signals. The spectacular gain in catalytic activity (FIG. 3) must be due to a reinforcement of the acid strength by introducing distorted tetrahedral, pentacoordinated and octahedrally coordinated aluminum into the zeolite. The NMR spectrometer was run under experimental conditions such that absolute signal intensities can be compared (Table 2). The $^{27}$Al MAS NMR signal of the parent zeolite was taken as reference. The $^{27}$Al MAS NMR signal in all samples subjected to ALD was higher than in the parent zeolite. The sequence of $^{27}$Al MAS NMR intensity of Z0<Z4<Z5<Z2<Z3<Z1 reflect the integrated exposure time to TMA over the cycles the sample was subjected to.

(Z0=Parent zeolite CBV 712; Z1=30 cycles of 480 s; Z2=30 cycles of 120 s; Z3=10 cycles of 480 s; Z4=10 cycles of 120 s; Z5=5 cycles of 480 s).

TABLE 2

Total signal intensity of $^{27}$Al MAS NMR spectra of ultrastable Y zeolites (spectra shown in FIG. 5)

| sample | Area (a.u.) |
|--------|-------------|
| Z0 | 1.0000 |
| Z1 | 1.8772 |
| Z2 | 1.4094 |
| Z3 | 1.5725 |
| Z4 | 1.2614 |
| Z5 | 1.3748 |

Example 8

$^{27}$Al MAS NMR of Aluminated Zeotile-4 (Hierarchical Material) and (S-1) Silicalite-1 Sample (Nanozeolite)

Figure 6:
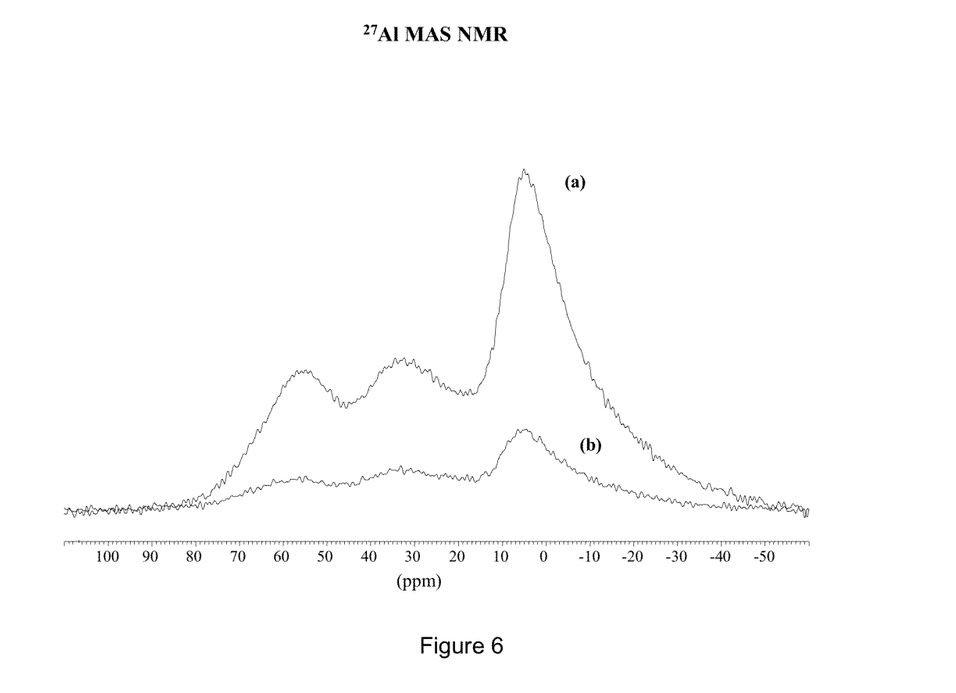
FIG. 6. $^{27}Al$ MAS NMR spectra of aluminated (a) Zeotile-4 sample and (b) Silicalite-1 nanozeolite.

The $^{27}$Al MAS NMR spectra of aluminated zeotile-4 (hierarchical material) from example 5 and (S-1) Silicalite-1 sample (Nanozeolite) from example 4 are shown in FIG. 6. These materials in their parent form do not contain any aluminum and show no signal in the $^{27}$Al MAS NMR experiment. The ALD of aluminum results in the formation of tetrahedral aluminum (55 ppm), distorted tetrahedral and pentacoordinated aluminum (30 ppm) and extraframework octahedral aluminum (0 ppm). The two samples were subjected to a same exposure to TMA (same number of cycles of a same duration). Nevertheless, the $^{27}$Al MAS NMR signal in the silicalite-1 sample is weaker than in the Zeotile-4 sample. The zeotile-4 sample is a hierarchical material with mesopores and micropores. The surfaces of the mesopores are hydroxylated and provide reactive sites for aluminum binding.

The silicalite-1 is a microporous material with small particle size (nanozeolite). The majority of hydroxyl groups suitable for ALD are located on the external surface of the zeolite particles. The alumination is expected to occur especially on the external surface. Quantification of the $^{27}$Al MAS NMR signals (Table. 3) confirms the lower NMR signal intensity in the aluminated silicalite-1 nanozeolite compared to the aluminated Zeotile-4 sample.

TABLE 3

Relative intensity of $^{27}$Al MAS NMR signal of aluminated Zeotile-4 sample and Silicalite-1 nanozeolite (spectra shown in FIG. 5) Same reference as in Table 2

| Sample | Area (a.u.) |
|--------|-------------|
| Aluminated Zeotile-4 | 0.72636 |
| Aluminated Silicalite-1 | 0.16925 |

Example 9

Figure 7:
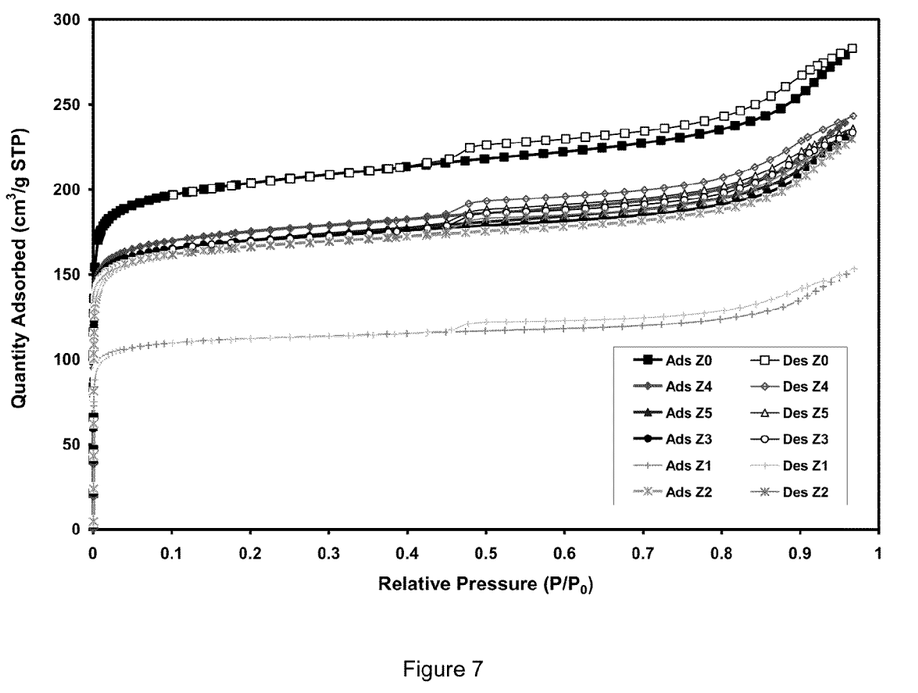
FIG. 7. Nitrogen adsorption isotherms on parent ultrastable Y zeolite and aluminated specimens.

Characterization of the Porosity of Aluminated Ultrastable Y Zeolites Using Nitrogen Adsorption Adsorption-desorption isotherms of nitrogen gas at −196° C. on the parent ultrastable Y zeolite and the ALD modified specimen are presented in FIG. 7. Alumination leads to a decrease of the nitrogen adsorption capacity. The samples show some hysteresis between adsorption and desorption branches of the isotherm. This hysteresis is caused by capillary condensation in mesopores. The ALD treatment does not eliminate the mesopores. The surface area (mesoporous+external) and micropore volume of the ultrastable Y zeolite samples has been calculated from t-plots using as reference, the Hakins-Jura equation to calculate the thickness of adsorbed nitrogen layer as a function of P/Po. The calculated values are listed in Table 4.

TABLE 4

Texture of ultrastable Y zeolites aluminated via ALD

| Sample code | Al content | Mesopore and external surface area (m²/g) | micropore volume (mL/g) |
|-------------|------------|-------------------------------------------|-------------------------|
| Z0 | 1 | 102 | 0.27 |
| Z4 | 1.2614 | 64 | 0.23 |
| Z5 | 1.3748 | 76 | 0.24 |
| Z2 | 1.4094 | 64 | 0.23 |
| Z3 | 1.5725 | 77 | 0.23 |
| Z1 | 1.8772 | 32 | 0.16 |

Figure 8:
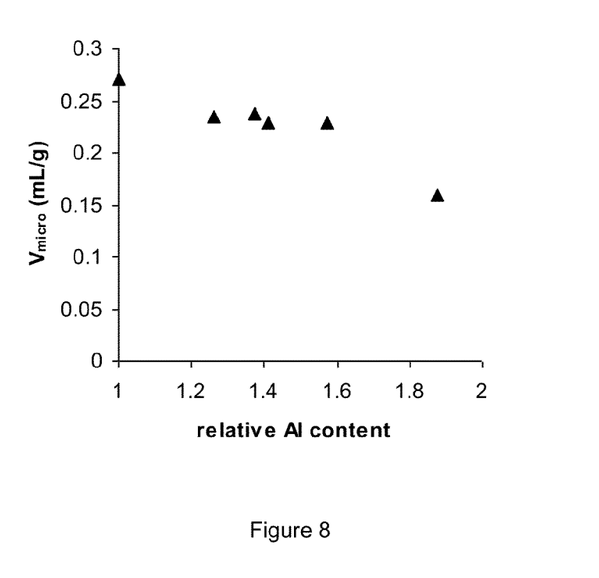
FIG. 8. Evolution of the micropore volume with relative aluminum content introduced via ALD.

The parent sample (Z0) has the highest microporosity. The introduction of aluminum via ALD leads to a moderate loss of microporosity. In the most loaded Z1 sample the microporosity loss is more pronounced. This decrease in microporosity can be explained by two effects. First, the introduced aluminum will occupy space inside the micropores. Second, the aluminum introduction causes an increase in weight of the zeolite. The CBV-712 zeolite has a Si/Al ratio of ca. 6/1. For an increase of the Al content by 40%, and taking an $Al_2O_3$ formula to represent the incorporated aluminum, a weight gain of the sample by 10% can be expected. As the introduced alumina is not expected to create additional pores, a decrease of the porosity by 10% can be explained by the weight gain. In conclusion, the ALD treatment did not close off micropores in Z2-Z5 samples. In the most severely treated sample (Z1), there is a significant loss of microporosity that may be due to pore blocking by aluminum incorporated via ALD. The evolution of micropore volume with alumination of the ultrastable Y zeolites is plotted in FIG. 8.

Figure 9:
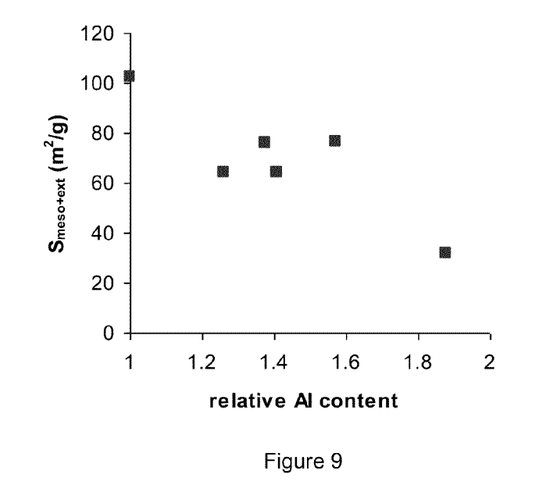
FIG. 9. Dependence of mesopore and external surface area with relative aluminum content of ultrastable Y zeolite.

The parent zeolite (Zo) has largest surface area in mesopores and on the external crystal surface (Table 4). The external surface area of these Y zeolites is quite small, so that the determined surface area is due to mesopores mainly. The surface area in the mesopores of Z2-5 samples having a similar alumination level is similar. The most strongly aluminated sample has the lowest mesopore surface area (Z1). The mesopore surface area per gram of ultrastable Y zeolite gradually decreases with Al content (FIG. 9). This is due to the weight gain and to the coverage of the mesoporous cavities with alumina species, decreasing the surface area.

Example 10

Figure 10:
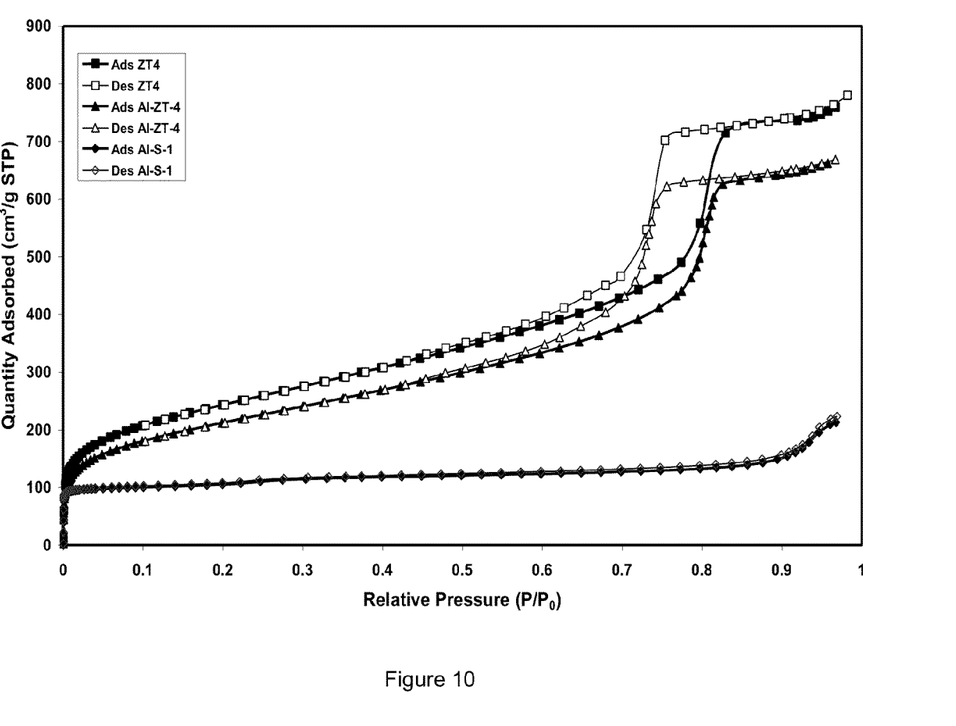
FIG. 10. Adsorption-Desorption Isotherms for the aluminated Zeotile-4 (Al-ZT-4) and Silicalite-1 (Al-S-1).

Nitrogen Adsorption Measurements on Zeotile-F (Al-ZT-4) and Silicalite-1 (Al-S-1) Samples Adsorption—desorption Isotherms for the aluminated Zeotile-4 (Al-ZT-4) and Silicalite-1 (Al-S-1) are shown in FIG. 10. The Zeotile-4 sample presents an hystereris loop with parallel branches owing to the presence of well defined mesopores after ALD treatment.

The Silicalite-1 zeolite is a microporous material with strong nitrogen adsorption at low relative pressure followed by a plateau.

Example 11

Decane Catalytic Test Over Bifunctional Silicalite (Al-S-1) and Zeotile-4 (Al-ZT-4) Samples The catalytic activity of the aluminated zeolites was evaluated using the decane hydroconversion as probe reaction.

Figure 11:
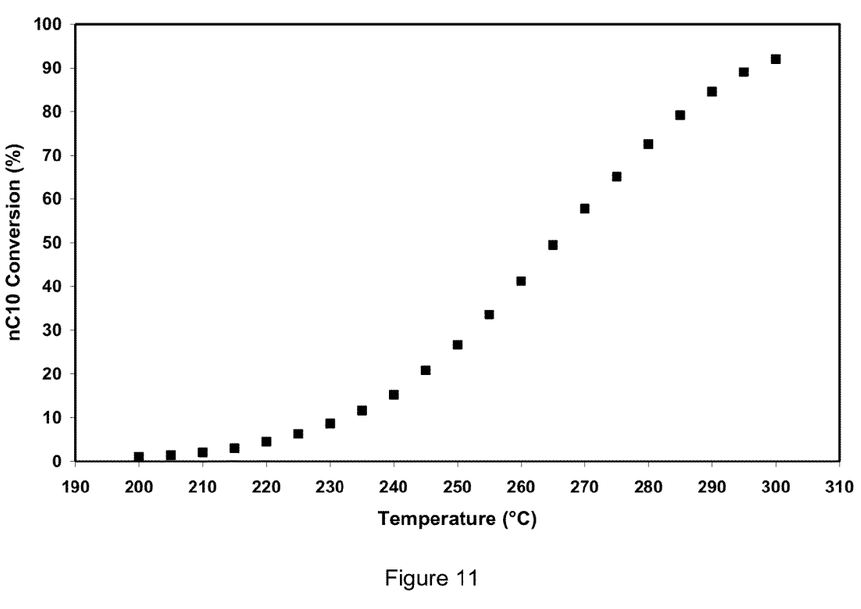
FIG. 11. Decane conversion as a function of temperature over Pt/Al-Zeotile-4 (■).
Figure 12:
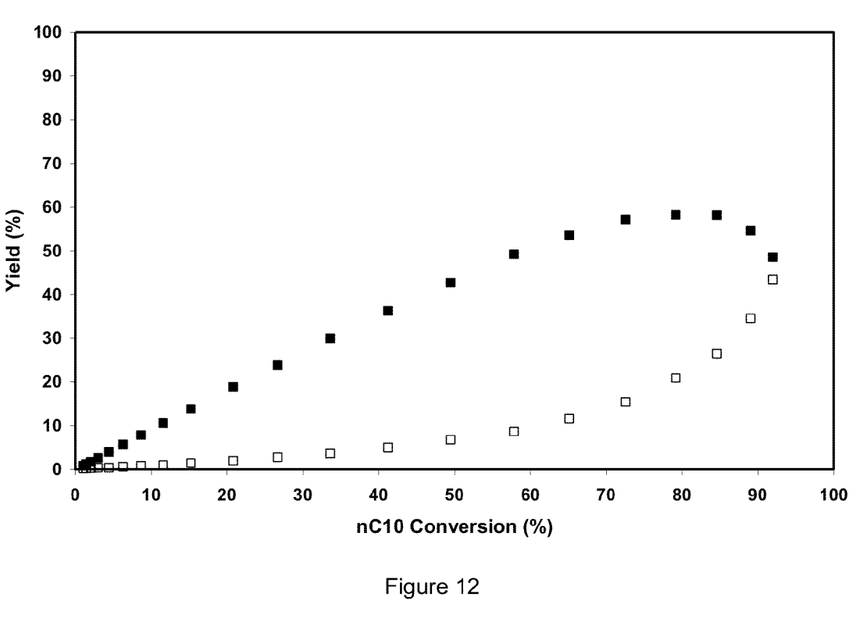
FIG. 12. Yield of skeletal isomers and cracked products as a function of decane conversion over Pt/Al-Zeotile-4 (iso:■; crack:□).

The aluminated zeolite-4 and the silicalite-1 and the parent samples were loaded with platinum metal and evaluated in decane hydroconversion as explained for the ultrastable Y zeolites in example 6. The parent samples were inactive at reaction temperatures below 350° C. The aluminated zeotile-4 material was active starting at 220° C. (FIG. 11). Decane isomerization and cracking are consecutive reactions (FIG. 12), indicating that the platinum loaded aluminated Zeotile-4 is a bifunctional catalyst presenting a well balanced acid and hydrogenation-dehydrogenation function (ref. 36).

Example 12

Incorporation of Gallium in Ultrastable Y Zeolite (Mesoporous Zeolite) Using ALD The ALD experiment was similar to that performed on the ultrastable Y zeolite in example 3 with the following modifications.

For the present experiments, Ga(acac)$_3$ and water were used as reagents, and no plasma was used. The ultrastable Y zeolite powder (350 mg) was introduced in an Al vessel, which was placed on top of a resistive heater. The zeolite contained ca. 20% water. During a first series of experiments, the powder was loaded overnight in the ALD reactor at a temperature of 100° C., resulting in a base pressure of $1*10^{-7}$ mbar. Alternatively, water desorption could be achieved by heating the powder in a tube furnace for 3 hours at 150° C. After loading the powder in the ALD chamber, a base pressure of $2.10^{-6}$ mbar could be achieved.

An amount of ca.300 mg of zeolite powder was subjected to ALD cycles at 370° C. Two different types of cycles were used.
(1) Cycles of 480 s, comprising 120 s of exposure to Ga(acac)$_3$, 120 s evacuation, 120 s exposure to H$_2$O pulse and 120 s evacuation: different samples were subjected to 5, 10 and 30 cycles.
(2) Cycles of 120 s, comprising 30 s of exposure to Ga(acac)$_3$, 30 s evacuation, 30 s exposure to H$_2$O and 30 s evacuation. Zeolite samples were exposed to 10 and 30 cycles.

Example 13

Incorporation of Gallium in Silicalite-1 (Nanozeolite Material) Using ALD

The ALD experiment was similar to that performed on the ultrastable Y zeolite in example 12. For this powder, no water desorption step was required. Gallium deposition on silicalite-1 powder sample from example 1 was done at 370° C. in 10 cycles. A cycle comprised 30 s Ga(acac)$_3$ exposure, 30 s evacuation, 30 s H$_2$O exposure and 30 s evacuation.

Example 14

Gallium Deposition on Zeotile-4 (Hierarchical Material) Using ALD

The ALD treatment was performed on the Zeotile-4 sample from example 2. The zeotile sample was initially heated to 200° C. for 2 h in vacuum to desorb the water. The base pressure after 2 h was $2.10^{-6}$ mbar. ALD deposition was performed at 370° C. The treatment consisted of 10 cycles, each comprising 30 s exposure to trimethylgallium, 30 s evacuation, 30 s H2O exposure and 30 s evacuation.

REFERENCES CITED

[1] L. B. McCusker et al., Pure Appl. Chem. 2001, 73, 381-394.
[2] J. Rouquerol et al., Pure Appl. Chem. 1994, 66, 1739-1758.
[3] C. T. Kresge et al., Nature 1992, 359, 710-712.
[4] A. Monnier et al., Science 1993, 261, 1299-1303.
[5] D. Zhao et al., Science 1998, 279, 548.
[6] S. Inagaki et al., Bull. Chem. Soc. Jpn. 1996, 69, 1449-1457.
[7] J. C. Jansen et al., Chem. Commun. 2001, 8, 713-714.
[8] A. H. Janssen, Angew. Chem. Int. Ed. 2001, 40, 1102-1104.
[9] Jacobsen et al., J. Am. Chem. Soc. 2000, 112, 7116-7117.
[10] Kim et al., Chem. Mater. 2003, 15, 1932-1934.
[11] Y. Tao et al., J. Phys. Chem. B 2003, 107, 10974-10976.
[12] S P B Kremer et al., Adv. Mater. 2003, 15, 1705-1707.
[13] J. A. Martens et al., PCT Int. Appl. 2005, WO 2005 000740 A2.
[14] R. Szostak, in H. van Bekkum, E. M. Flanigen, J. C. Jansen (Eds.), Introduction to zeolite science and practice, Stud. Surf. Sci. catal. 58, Elsevier, 1991, pp. 153-192.
[15] Gunter H Kuhl, in J. Weitkamp, L. Puppe (Eds) Catalysis and Zeolites, Fundamentals and Applications, Springer 1999, pp 81-179.
[16] M W Anderson et al., Chem. Commun. 1984, 23, 1596-1597
[17] T. Yashima et al., in P. J. Grobet et al. (Eds) Innovation in zeolite materials science, Stud. Surf. Sci. catal. 37, Elsevier 1988, pp. 175-182.
[18] Catana, G. et al., J. Phys. Chem. B 2000, 104, 9195-9202.
[19] A. S. O'Neil et al., J. Am. Chem. Soc. 2002, 124, 10636-10637
[20] L. Y. Chen et al., *Microporous and Mesoporous Materials* 1999, 27, 231-242.
[21] L. C. Guan et al., J. Phys. Sci. 2006, 17, 65-75.
[22] R. Mokaya and W. Jones, J. Mater. Chem. 1999, 9, 555-561
[23] Y. Oumi et al., *Microporous and Mesoporous Materials* 44-45, 2001, 267-274
[24] Lim et al., Nature Materials 2003, 2, 749-54.
[25] www.cambridgenanotech.com.
[26] Riikka Puurunen, PhD Thesis, Department of Chemical Technology, Helsinki University of Technology (Espoo, Finland), 2002
[27] R. L Pruunen et al., Applied Surface Science 2000, 165, 193-202
[28] Falconer et al., US Patent, US006043177A
[29] P C Stair et al., Topics in catalysis 2006, 39, 181-186.
[30] Elam, J. W et al., ECS Transactions 2007, 11, 177-184
[31] Elam, J. W et al., Journal of Nanomaterials 2006.
[32] Jiang et al., J. Am. Chem. Soc. 2006, 128, 11018-1101.

[33] Ravishankar et. al., J. Phys. Chem. B 1998, 102, 2633-2639.
[34] Huybrechts W. et al., Appl. Cat A Gen. 2003, 243, 1-13
[35] Grobet et. al., chemm. Commun. 1987, 22, 1688-90
[36] Weitkamp J, Ind. Eng. Chem. Prod. Res. Dev. 1982, 550-558.
[37] Herrera et al., Topics in Catalysis, 2006, 39: 3-4
[38] Du et al., J. Catal 2008, 253, 74-90
[39] Mahurin et al., Journal of Non-Crystalline Solids 2006, 352, 3280-3284
[40] Funke et al. US Patent, US006051517A

The invention claimed is:

1. A method for increasing the acid catalytic activity of a silicate based nanoporous material, said method comprising: incorporating a chemical element in said material using an atomic layer deposition process under conditions favoring the hydrolysis of a compound comprising said chemical element so that the incorporating of the chemical element increases the acid catalytic activity of the silicate based nanoporous material.

2. The method according to claim 1, wherein the atomic layer deposition process is performed with a gaseous metal compound and water reactants.

3. The method according to claim 2, wherein the element is a trivalent element.

4. The method according to claim 3, wherein the trivalent element is aluminum, gallium, iron or boron.

5. The method according to claim 4, wherein said silicate based nanoporous material is selected out of the group consisting of mesoporous zeolites, nanozeolites, ordered mesoporous materials and hierarchical materials.

6. The method according to claim 5, wherein aluminum is incorporated in said silicate based nanoporous material using atomic layer deposition cycles with trimethylaluminum and water reactants.

7. The method according to claim 6, wherein said silicate based nanoporous material is a silicate-based nanoporous material that became deactivated during operation because of dealumination.

8. The method according to claim 6, wherein said incorporating aluminum comprises selectively aluminating an external surface of nanozeolites.

* * * * *